United States Patent [19]

Hatakeyama

[11] Patent Number: 5,757,691
[45] Date of Patent: May 26, 1998

[54] SEMICONDUCTOR MEMORY DEVICE HAVING WIRING FOR SELECTION OF REDUNDANT CELLS BUT WITHOUT USELESS REGION ON CHIP

[75] Inventor: Atsushi Hatakeyama, Kawasaki, Japan

[73] Assignee: Fujitsu Limited, Kanagawa, Japan

[21] Appl. No.: 869,637

[22] Filed: Jun. 5, 1997

[30] Foreign Application Priority Data

Dec. 27, 1996 [JP] Japan .................................. 8-351221

[51] Int. Cl.$^6$ ........................................................ G11C 5/06
[52] U.S. Cl. .......................... 365/63; 365/51; 365/200
[58] Field of Search ............................ 365/63, 51, 200; 257/351, 369

[56] References Cited

U.S. PATENT DOCUMENTS 5,621,679  4/1997  Seo et al. ............................. 365/63
5,687,108  11/1997  Proebsting ............................ 365/63

Primary Examiner—Vu A. Le
Attorney, Agent, or Firm—Nikaido, Marmelstein, Murray & Oram LLP

[57] ABSTRACT

A semiconductor memory device includes: cell arrays each including a normal cell array portion and a redundant cell array portion in which a plurality of normal cells and a plurality of redundant cells are arranged respectively; a first wiring, laid out in a row direction within the redundant cell array portions, for selecting the redundant cells; a second wiring orthogonal to the first wiring and formed on a different wiring layer from the first wiring; a peripheral circuit region; and a redundancy judgment circuit placed in the peripheral circuit region. The first wiring is connected with the second wiring within the cell arrays, and connected to the redundancy judgment circuit by way of the second wiring. Owing to this configuration, the wiring for selecting the redundant cells can be arranged without the need of forming a useless region on a chip. This contributes to the effort to stop the area of a chip from increasing.

7 Claims, 9 Drawing Sheets

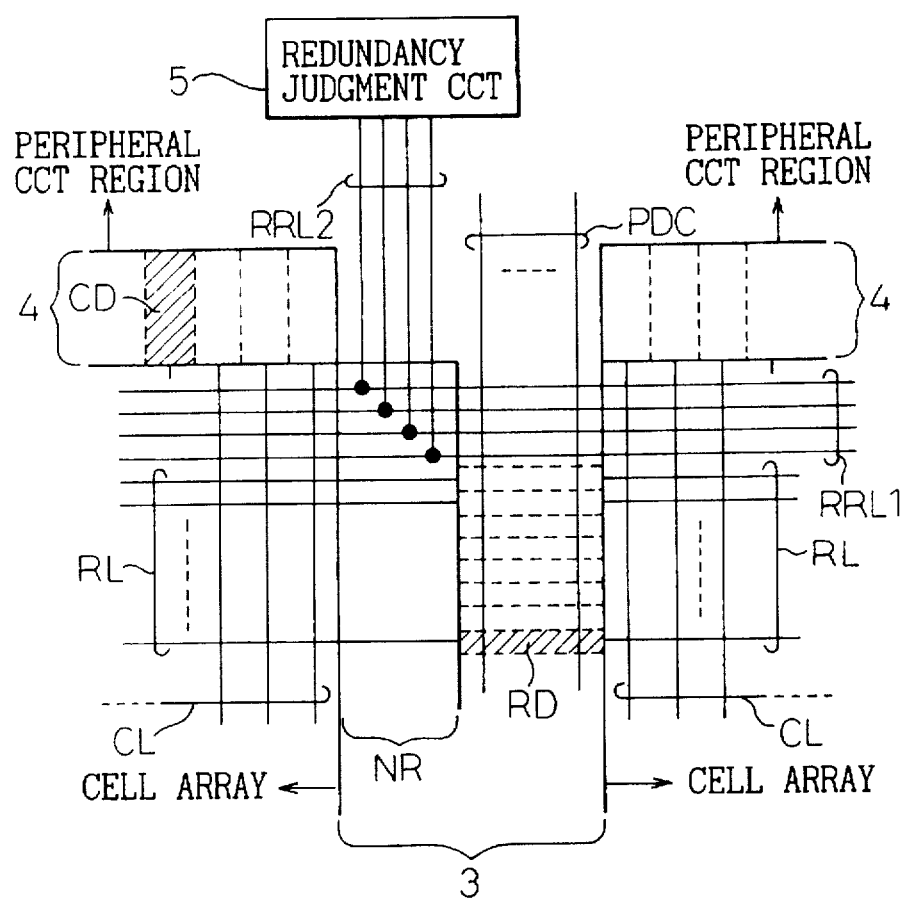

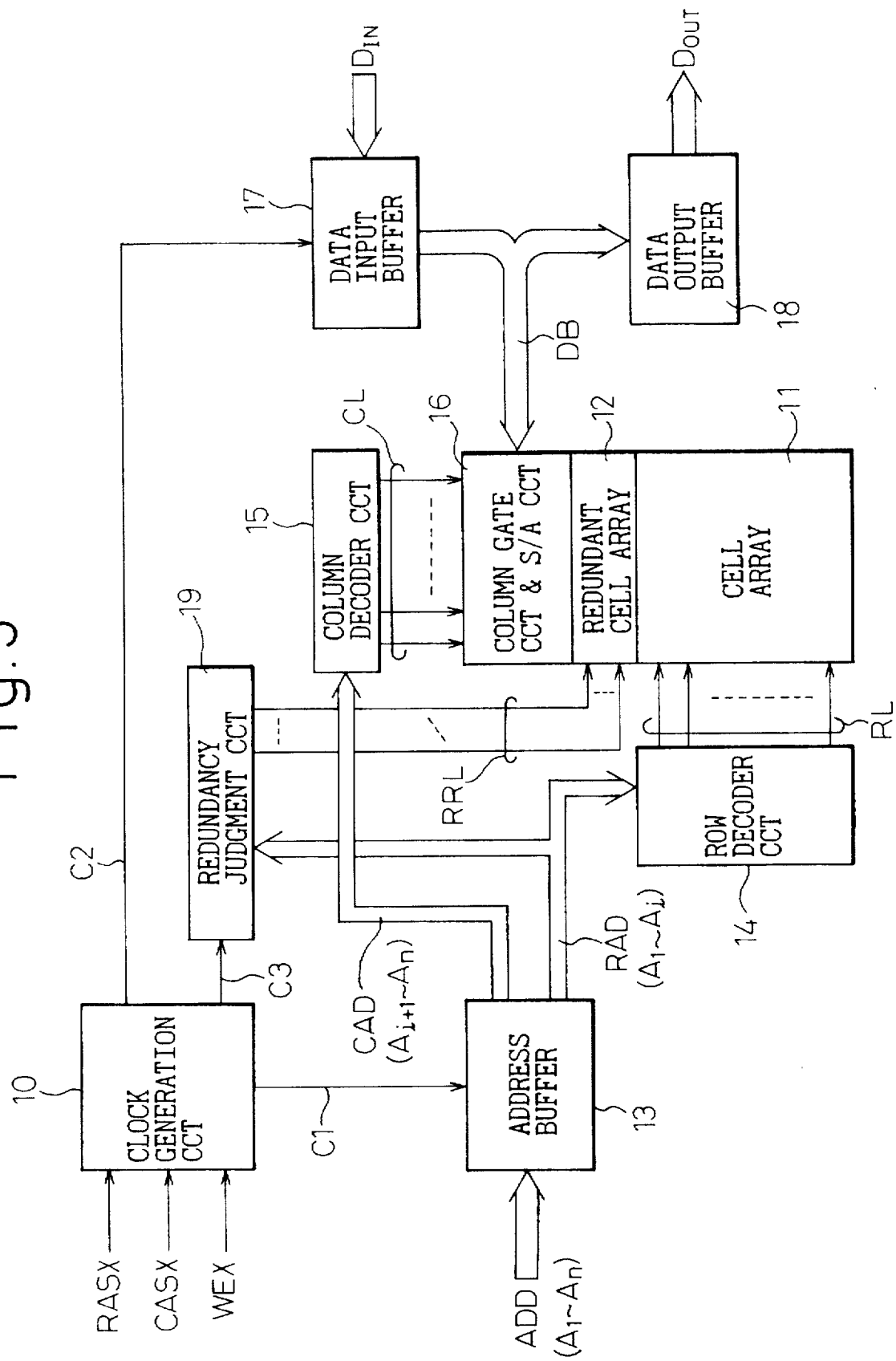

SEMICONDUCTOR MEMORY DEVICE HAVING WIRING FOR SELECTION OF REDUNDANT CELLS BUT WITHOUT USELESS REGION ON CHIP

BACKGROUND OF THE INVENTION

1. Field of the Invention

The present invention relates to a semiconductor memory device, or more particularly, to an art of laying out wiring for selecting redundant cells in a semiconductor memory device having the redundant cells. In the description below, what is referred to merely as a "cell (or redundant cell)" indicates a "memory cell (or redundant memory cell)."

2. Description of the Related Art

In recent years, semiconductor memory devices have suffered from an increasing probability that a normal cell malfunctions because of a defect occurring in the course of manufacturing due to the introduction of microprocessing and an increase in the size of the chips. This necessitates employment of numerous redundant cells for the purpose of rescuing such defective parts after manufacture. However, an increase in the number of redundant cells leads to an increase in the amount of wiring for selecting the cells. There is the fear that the area of the chips will increase. When a chip area increases, manufacturing efficiency deteriorates and it becomes meaningless to increase the number redundant cells. Under these circumstances, there is a demand for a layout art enabling selection of redundant cells without an increase in chip area.

For example, referring to FIG. 2a, the configuration of a semiconductor memory device in the form of a chip is shown schematically. The configuration shown in FIG. 2a will be described later in relation to the configuration of the present invention. The configuration itself is not a constituent feature of the present invention.

In the drawing, there are shown cell arrays 1. In the illustrated example, eight cell arrays are formed on a chip. Each cell array 1 is composed of a normal cell array portion in which a plurality of normal cells are arranged in the form of a matrix, and a redundant cell array portion in which a plurality of redundant cells are arranged in the form of a matrix. In the normal cell array portion, row lines for selecting cells in an X (row) direction, and column lines for selecting cells in a Y (column) direction are laid out. Likewise, in the redundant cell array portion, redundant row lines for selecting redundant cells in the X direction and redundant column lines for selecting redundant cells in the Y direction are laid out.

Each cell array 1 has cells laid out so that the cell array is shaped like a square. A row decoder circuit 3 and column decoder circuit 4 are arranged adjacently to two sides of the square. There is also shown a peripheral circuit region 2 that is separated from the cell arrays 1 (with the column decoder circuits 4 between them). A redundancy judgment circuit (not shown in FIG. 2a) is placed in the peripheral circuit region 2.

In a normal operation mode, an externally-input address signal is decoded. Based on the result of decoding, one row line (composed normally of a plurality of word lines) and one column line (composed normally of a plurality of pairs of bit lines) are selected. Data is then written in or read from a cell formed at the intersection between the lines.

In a redundancy operation mode, actions are carried out as described below. For example, if a defect occurs on a certain row line in the course of manufacturing, the row address of the defective row line is stored in the redundancy judgment circuit. If an input address agrees with the row address, a redundant row line is selected in place of the defective row line. The same applies to a column line.

As seen from the configuration shown in FIG. 2a, one end of each of the column lines laid out in the Y direction is connected with the peripheral circuit region 2, while the normal row lines and redundant row lines laid out in the X direction within the cell arrays 1 are separated from the peripheral circuit region 2 (that is, placed with the column decoder circuits 4 between them).

It is therefore necessary to lay out wiring, which links the redundant row lines and the redundancy judgment circuit placed in the peripheral circuit region 2, in a region other than the peripheral circuit region 2.

According to a known art, as shown as an example in FIG. 1, the wiring is arranged in the region of each row decoder circuit 3 so that the wiring (wiring RRL2 in the drawing) overlaps the row decoder circuit. In FIG. 1, there are shown normal row lines RL laid out in the X direction, redundant row lines RRL1 laid out in the X direction, column lines CL laid out in the Y direction, row decoders RD, column decoders CD, a pre-decoding signal PDC, and a "useless region" NR that will be described later.

The width of each row decoder circuit 3 depends on the number of lines laid out above the row decoder circuit. A signal for use in selecting a normal row line RL is the pre-decoding signal PDC. For selecting, for example, 2048 row lines, 4+8+8+8=28 pre-decoding signal lines are needed. For example, when each row decoder RD is formed with a NAND circuit having four inputs, and twenty-eight pre-decoding signal lines are connected to the inputs, one of 2048 row lines can be selected.

In contrast, in the case of a signal for use in selecting a redundant row line RRL1, unlike the pre-decoding signal PDC, the number of signal lines cannot be reduced. For example, when there are 16 redundant row lines, 16 wires must be laid in the region of each row decoder circuit 3.

According to the known way of laying out wiring, there is a drawback that the width of each row decoder circuit becomes relatively large. Moreover, as shown in FIG. 1, there is a problem in that the useless region NR in which no circuit resides is formed in the region of each row decoder circuit. This leads to an increase in the area of a chip constituting a semiconductor memory device. An improvement is awaited.

SUMMARY OF THE INVENTION

An object of the present invention is to provide a semiconductor memory device making it possible to arrange wiring for selecting redundant cells without creating a useless region on a chip, and to eventually stop the area of the chip increasing.

According to the present invention, there is provided a semiconductor memory device comprising: cell arrays each including a normal cell array portion and redundant cell array portion in which a plurality of normal cells and a plurality of redundant cells are arranged respectively; a first wiring, laid out in a row direction within the redundant cell arrays, for selecting said redundant cells; a second wiring orthogonal to the first wiring and formed on a different wiring layer from the first wiring; a peripheral circuit region; and a redundancy judgment circuit, placed in the peripheral circuit region, for determining the voltage level of the first wiring. In the semiconductor memory device, the first wiring is connected with the second wiring within the cell arrays, and thus connected to the redundancy judgment circuit by way of the second wiring.

BRIEF DESCRIPTION OF THE DRAWINGS

Other objects and features of the present invention will be described hereinafter in detail by way of preferred embodiments with reference to the accompanying drawings, in which:

FIG. 1 is a diagram for explaining a problem on layout of redundant row lines underlying a prior art;

FIG. 3 is a block diagram schematically showing the overall configuration of a semiconductor memory device employed in the embodiments of the present invention;

DESCRIPTION OF THE PREFERRED EMBODIMENTS

Figure 2A:
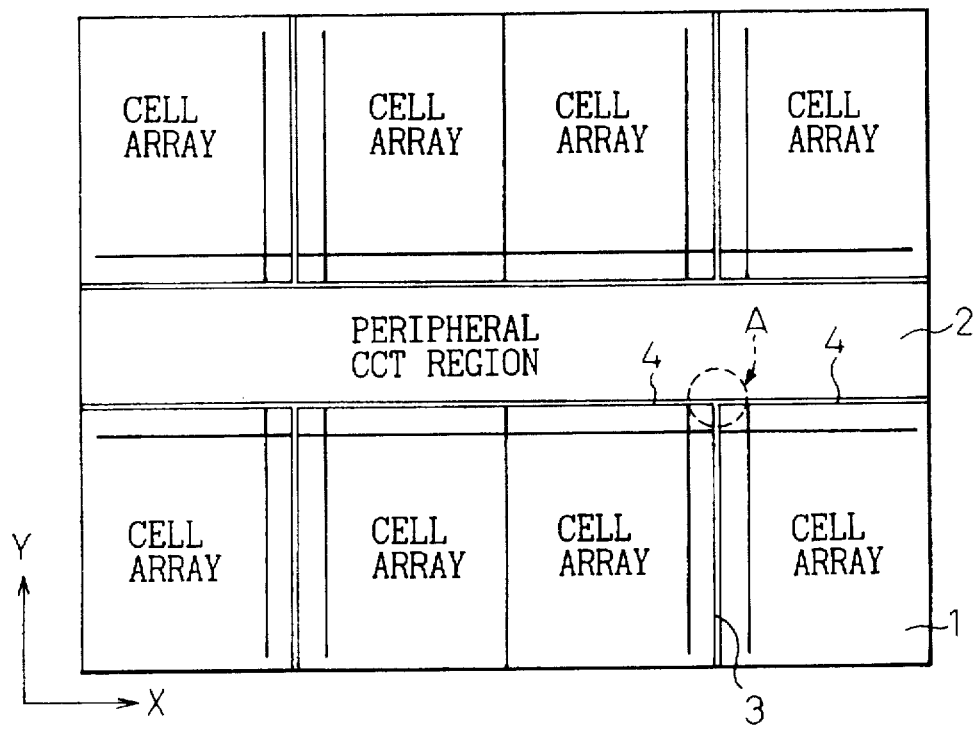
FIGS. 2a and 2b are diagrams showing the principles and configuration of a semiconductor memory device in accordance with the present invention.
Figure 2B:
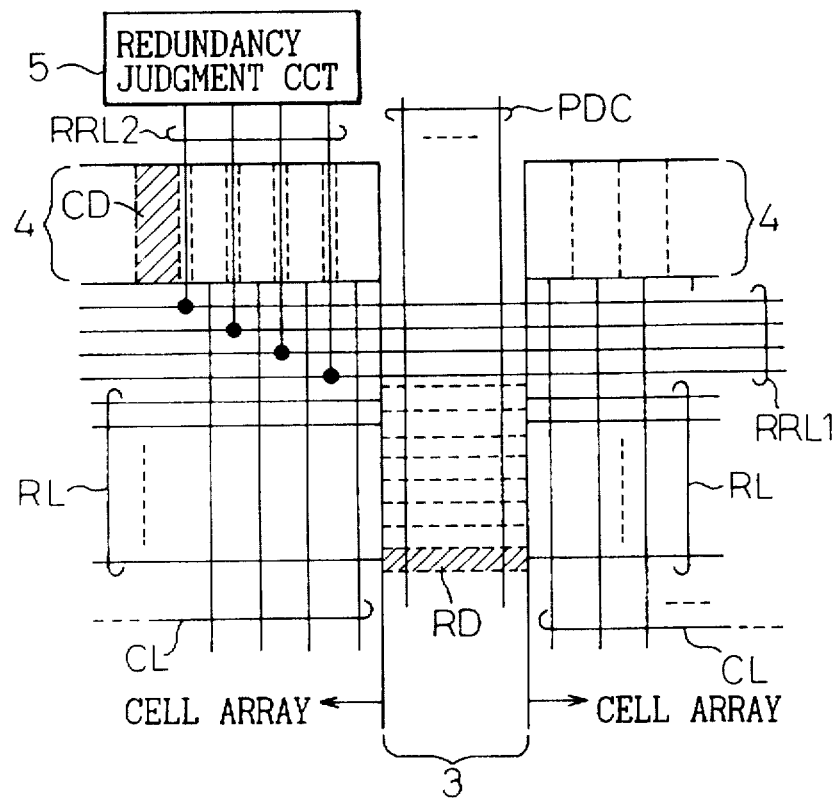

FIG. 2a schematically shows the configuration of a semiconductor memory device of the present invention in the form of a chip, and FIG. 2b shows portion A indicated with a dashed line in FIG. 2a in enlargement.

In an effort to solve the aforesaid problems underlying the prior art, according to the present invention, wiring for linking redundant row lines and a redundancy judgment circuit is formed in a direction, in which the wiring becomes orthogonal to the redundant row lines, on a wiring layer different from a wiring layer on which the redundant row lines are formed. The wiring is connected with the redundant row lines within cell arrays.

In other words, as shown in FIGS. 2a and 2b, the semiconductor memory device of the present invention comprises cell arrays 1 each including a normal cell array portion and a redundant cell array portion, a first wiring (redundant row lines) RRL1 for selecting redundant cells within the redundant cell array portions in a row direction, a second wiring RRL2 orthogonal to the first wiring and formed on a different wiring layer from the first wiring, a peripheral circuit region 2 separated from the cell arrays 1, and a redundancy judgment circuit 5 placed in the peripheral circuit region for determining the voltage level of the first wiring RRL1. The first wiring RRL1 is connected with the second wiring RRL2 within the cell arrays 1, and connected to the redundancy judgment circuit 5 via the second wiring.

According to a first preferred aspect of the present invention, in the semiconductor memory device, column decoder circuits 4 for selecting cells within the normal cell array portions in a column direction are arranged adjacently to the cell arrays 1, and the second wiring RRL2 is arranged so that the second wiring RRL2 runs through between adjoining column decoders CD constituting the column decoder circuits.

Also, according to a second preferred aspect of the present invention, in the semiconductor memory device, the pitch of the first wiring RRL1 is set to be larger than the pitch of the wiring (row lines) RL laid out within the normal cell array portions in the same direction as the first wiring.

Also, according to a third preferred aspect of the present invention, in the semiconductor memory device, column decoders of the column decoder circuits 4 located near positions, at which the second wiring RRL2 runs through, are shaped differently from the other column decoders in order to preserve spaces in which the second wiring is laid out.

Also, according to a fourth preferred aspect of the present invention, in the semiconductor memory device, a plurality of power supply wires are laid out within the cell arrays in the same direction as the second wiring RRL2 according to a certain repetitive pattern, and the second wiring RRL2 is laid out in place of part of the plurality of power supply wires.

As mentioned above, according to the present invention, the wiring RRL2 linking the redundant row lines RRL1 and redundancy judgment circuit 5 run through gaps in the column decoder circuits 4 within the cell arrays 1.

Each column decoder circuit is, normally, composed of a set of numerous column decoders, say, several hundred column decoders. The area of each column decoder is determined with an area occupied by circuit elements constituting the column decoder. It is therefore possible to lay several wires in a direction in which the wiring runs through between adjoining ones of column decoders without increasing the overall area of a column decoder circuit.

Moreover, the cells are laid out in places each having minimum dimensions. The pitch of row lines or column lines for selecting the cells is set to be larger than the pitch of the cells. It is therefore possible to Lay wiring among the column lines and preserve places, in which contacts with the wirings are formed, on the row lines without increasing the area of a chip.

Preferred embodiments of the present invention will be explained in detail with reference to FIGS. 3 to 9 below.

FIG. 3 schematically shows the overall configuration of a semiconductor memory device employed in the embodiments of the present invention.

In the drawing, there are shown a clock generation circuit 10 for generating various clocks (in the drawing, for brevity's sake, clocks C1 to C3 alone are shown), which are used Lo control the actions of circuits on a chip, in response to active-low control signals that are input externally (a row address strobe RASX, column address strobe CASX, and write enable signal WEX), a normal cell array 11, a redundant cell array 12, an address buffer 13 for buffering an n-bit address signal that is input externally, a row decoder circuit 14 for decoding an i-bit row address signal RAD read from the address buffer 13 and selecting any of row lines RL within the cell array 11, a column decoder circuit 15 for decoding an (n-i)-bit column address signal CAD read from the address buffer 13 and selecting any of column lines CL within the cell array 11, a column gate circuit and sense amplifier (S/A) circuit 16 for transferring data between the column decoder circuit 15 and cell array 11, a data input buffer 17 for buffering external input data DIN in response to the clock C2, a data output buffer 18 for buffering data read via the column gate circuit and S/A circuit 16 and outputting the data as output data DOUT, and a redundancy judgment circuit 19 for activating any of redundant row lines RRL within the redundant cell array 12 on the basis of the clock C3 and row address signal RAD. The ability of the redundancy judgment circuit 19 is the same as the aforesaid one.

In the configuration shown in FIG. 3, during reading, the information of a selected cell is output (DOUT) by way of the column gate circuit and S/A circuit 16, data bus DB, and data output buffer 18. During writing, external Input data DIN is written in the selected cell by way of the data input buffer 17, data bus DB, and column gate circuit and S/A circuit 16.

The configuration shown in FIG. 3 is illustrated as a model for explaining the transfer of signals among circuits, but does not indicate the actual physical layout of the circuits. The actual layout of the circuits (especially, the wiring) will be described below.

Figure 4A:
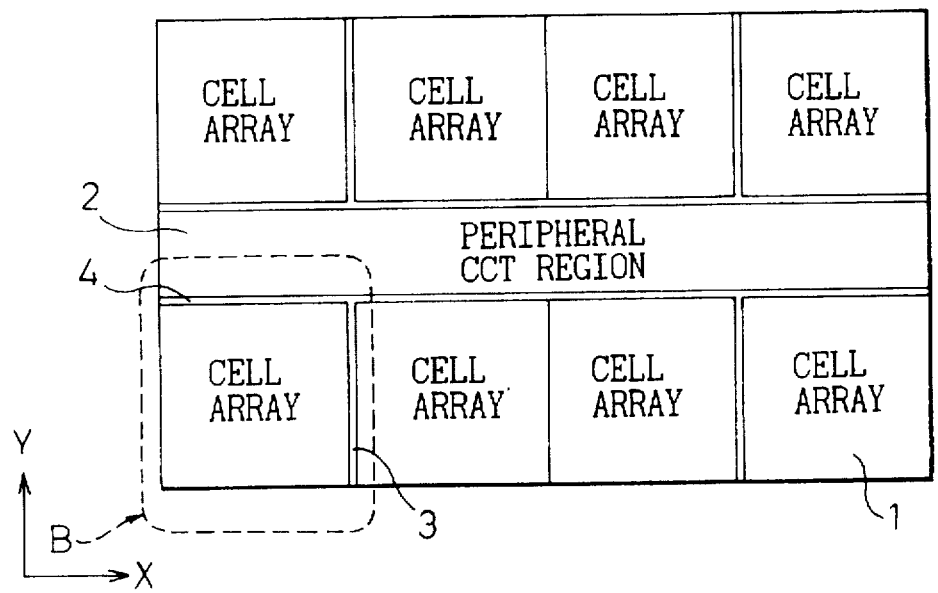
FIGS. 4a and 4b are diagrams schematically showing the configuration of a major portion of a semiconductor memory device of a first embodiment of the present invention.
Figure 4B:
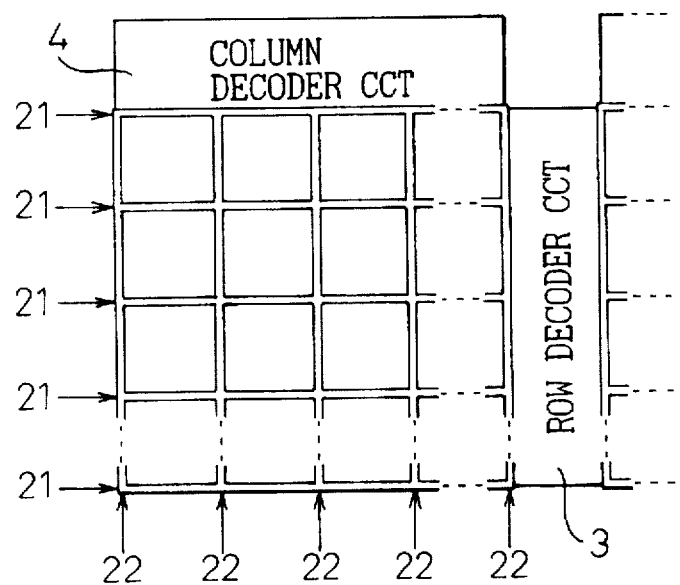

FIG. 4a schematically shows the configuration of the semiconductor memory device of the first embodiment of the present invention in the form of a chip, and FIG. 4b shows portion B indicated with a dashed line in FIG. 4a in enlargement.

The configuration shown in FIG. 4a is fundamentally identical to that shown in FIG. 2a. In this embodiment, as shown in FIG. 4b, a plurality of sense amplifier (S/A) circuits 21 are arranged parallel to column decoder circuits 4, and a plurality of sub-row decoder circuits 22 are arranged parallel to row decoder circuits 3.

Figure 5:
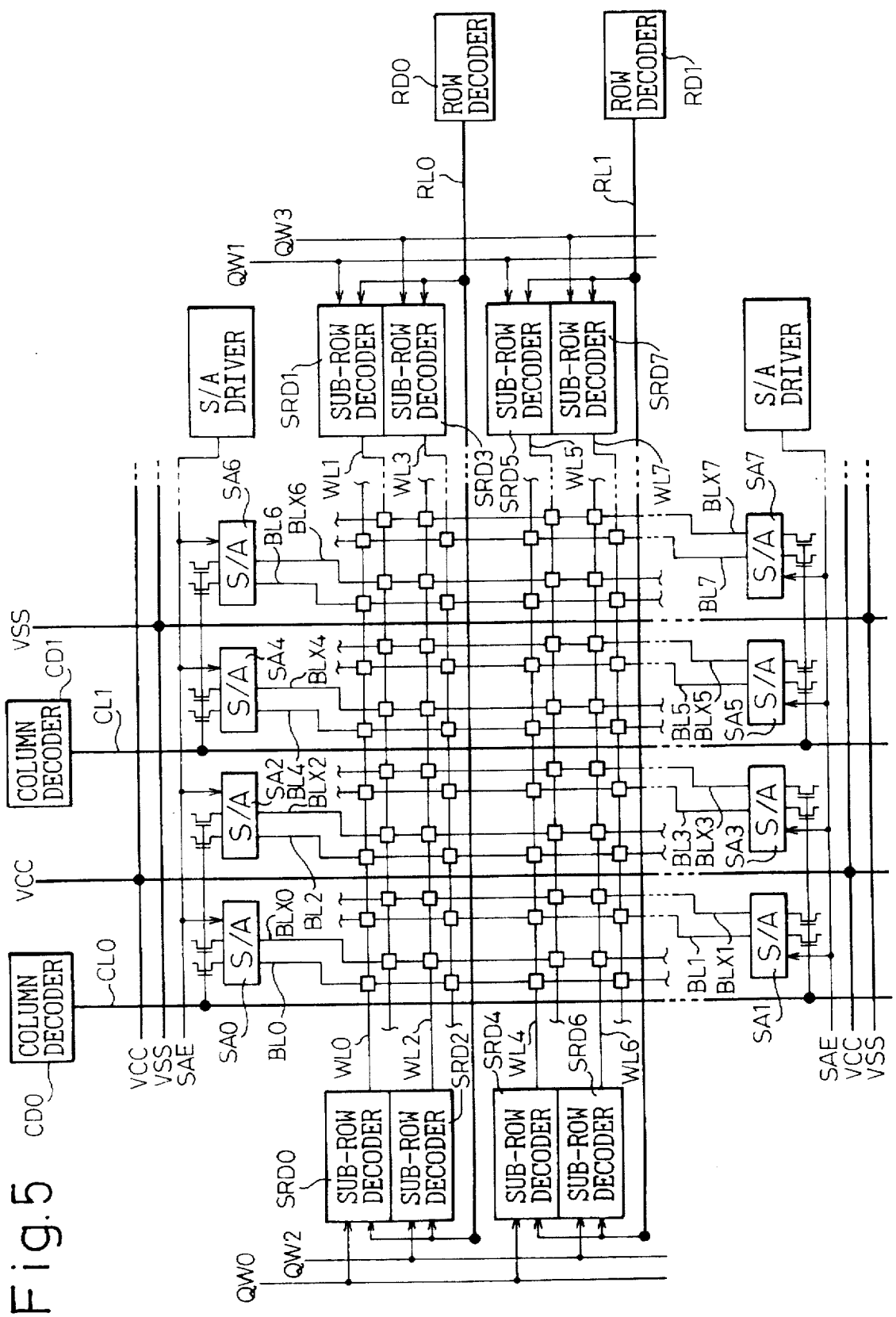
FIG. 5 is a diagram showing the configuration of a cell array shown in FIG. 4b in an enlargement.

FIG. 5 shows the configuration of one cell array 1 in enlargement. In the drawing, square parts at intersections between a plurality of word lines WLi (i=0 to 7) and a plurality of pairs of bit lines BLi and BLXi (i=0 to 7) correspond to one-bit cells. Actions to be made until data is output from a selected cell will be described below.

To begin with, a row address composed of a plurality of bits is input externally. Based on all the bits of the row address except two bits, one row decoder RDi (i=0 or 1) is selected, and an associated row line RLi (i=0 or 1) is activated. At the same time, the excluded two bits are decoded by a quarter decoder (not shown). Based on the result of decoding, any of signal lines QW0 to QW3 is activated. The signal on the activated row line and the QW signal are input to a sub row decoder SRDi (i=0 to 7) and logically synthesized. One word line WLi (i=0 to 7) is finally activated. This makes cells connected on this word line WLi all selected. Thus, a plurality of cells connected on one word line within the cell array 1 are selected.

The row lines RLi (i=0 or 1) are formed on the first wiring layer made of a metal, and are laid out within each cell array to have a pitch of four word lines WLi. In this embodiment, four word lines is a unit to be replaced with a redundant line. Specifically, four word lines WLi are replaced with one redundant row line. Cells selected with an activated word line send held data onto associated bit lines. The data is amplified by sense amplifiers (S/A) SAi (i=0 to 7), and then latched.

A column address is then input. One column decoder CDi (i=0 or 1) is selected accordingly, and an associated column line CLi (i=0 or 1) is activated. With activation of the column Line CDi, a transfer gate linking an associated sense amplifier (S/A) SAi and a data bus (not shown) is opened, and data latched by the S/A is sent onto the data bus. The data is amplified and output externally. Thus, reading is completed.

The column lines CLi (i=0 or 1) are formed on the second wiring layer made of a metal, and laid out within each cell array to have at a pitch of eight pairs of bit lines (BLi and BLXi). In other words, four S/As are selected at a time, and four bits are output at a time.

Power supply wirings VCC and VSS are laid out within the cell array. These lines are intended to supply power to sub row decoders SRDI and S/A drivers. In a row direction, the power supply lines are laid out along the S/A array. In a column direction, the power supply lines are laid out parallel to the column lines Cli so that one power supply line is interposed between adjoining column lines. All the power supply lines are laid out like a mesh within a cell array.

In FIG. 5, the wiring drawn with bold lines is metallic wiring. The wiring running in the row direction is wiring formed on the first layer, and that running in the column direction is wiring formed on the second layer. Wiring drawn with thin lines is wiring made of polysilicon. Black dots indicate that crossing wires are connected with each other.

Figure 6:
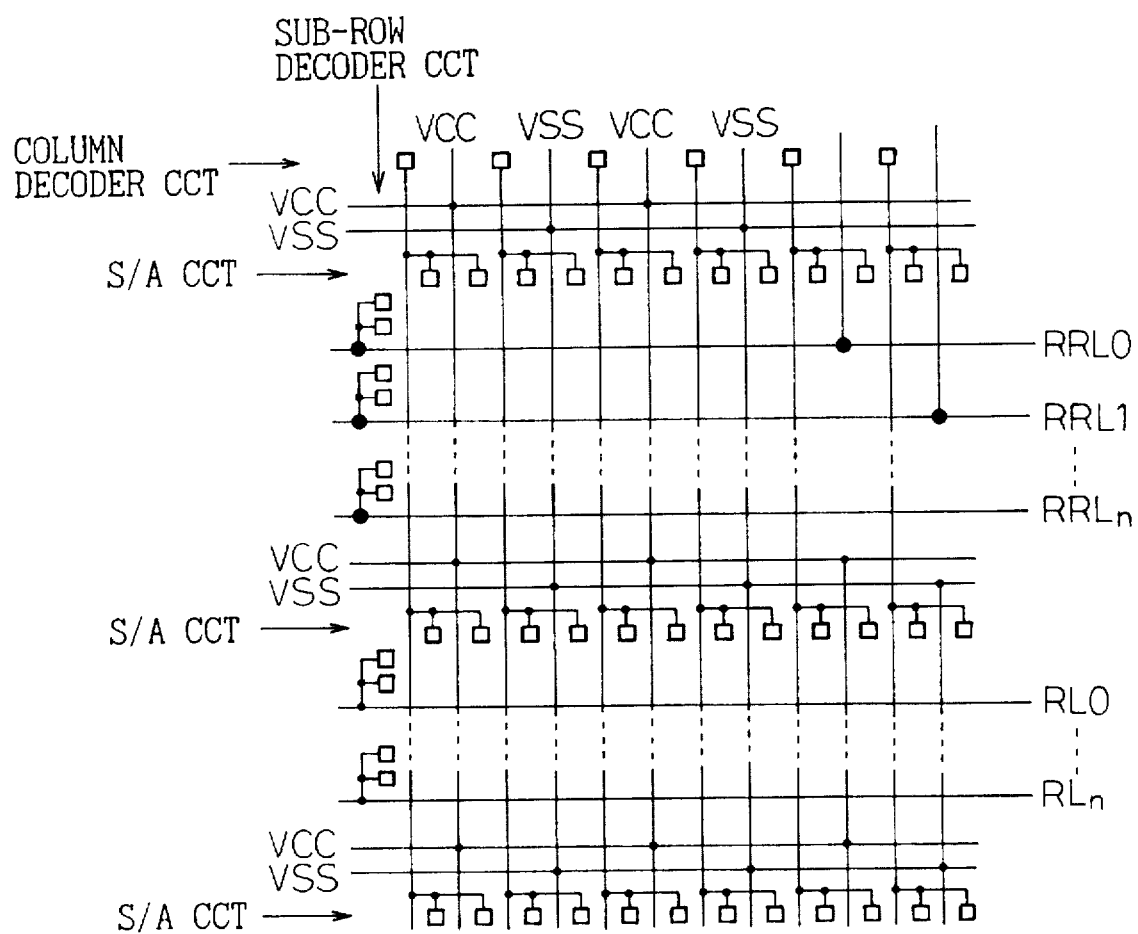
FIG. 6 is a diagram showing a portion of the configuration of the cell array shown in FIG. 4b which is a constituent feature of the present invention.

FIG. 6 shows a portion that is a constituent feature of the present invention in enlargement, wherein a wider range than the portion shown in FIG. 5 is illustrated. Normal cells, redundant cells, word lines, and bit lines are omitted for the sake of clarity.

As shown in FIG. 6, row lines RL0 to RLn are laid out in the row direction between S/A circuits, and redundant row lines RRL0 to RRln are laid out in the row direction between S/A circuits. The redundant row lines RRL0 to RRLn laid out in the row direction are formed on the first wiring layer, and connected with wiring formed in the column direction on the second wiring layer different from the first wiring layer. The redundant row lines are connected to a peripheral circuit region by way of the wiring. The wiring running in the row direction (wiring on the first layer), which is the redundant row lines, and the wiring running in the column direction (wiring on the second layer) come into contact within each cell array.

Figure 7:
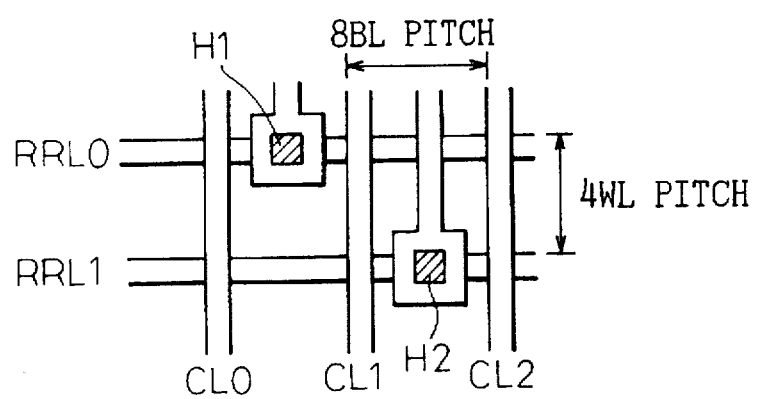
FIG. 7 is a diagram showing the layout of contacts between wiring on a first layer, which is redundant row lines, and wiring on a second layer in the first embodiment.

As shown in FIG. 7, for connecting the wiring on the first layer, which is the redundant row lines, with the wiring on the second layer, contact holes (indicated with H1 and H2) must be bored and clearance spaces for use in compensating for a displacement need be preserved around the contact holes. The contact hole and clearance space occupy a large area for the pitch of cells, and are therefore thought to be unpreferable. However, since the row lines (redundant row lines) are laid out within each cell array to have the pitch of four word lines (4WL), there is enough space for creating such contacts.

As for the wiring on the second layer connected with the redundant row lines, it is laid out in place of part of the power supply wires VCC and VSS. The space used to lay out the wiring can be preserved within each cell array and column decoder circuit. This is because since the power supply wires (VCC and VSS) are laid out like a mesh within each cell array, even if part of the power supply wiring is removed, no serious problem occurs.

Figure 8:
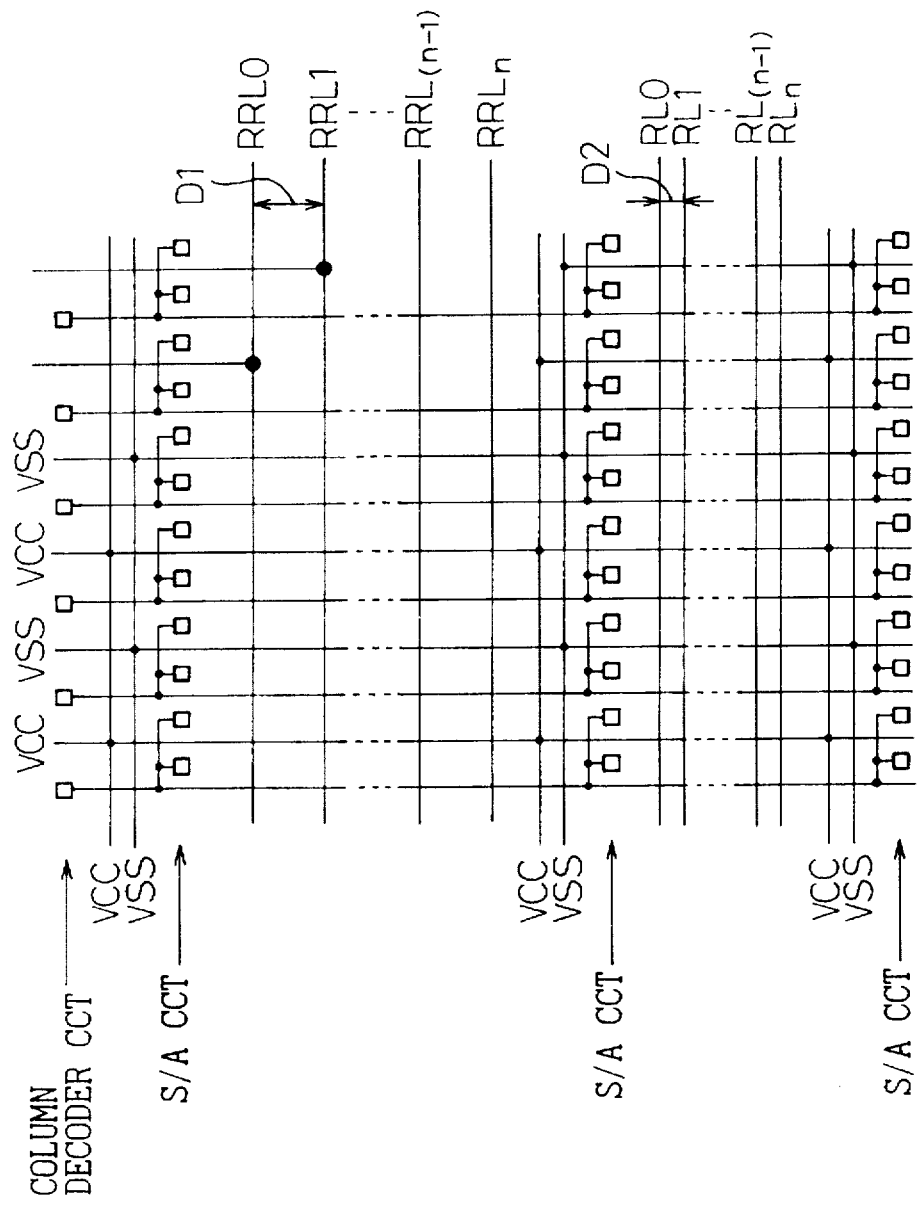
FIG. 8 is a diagram showing a portion of the configuration of a second embodiment of the present invention which is a constituent feature of the present invention.

In the aforesaid first embodiment, the row lines are laid out to have a moderate pitch. Even when the row lines are laid out to have the same pitch as the cells, if measures are taken as described below, the present invention can apply. FIG. 8 shows an example in which the measures are taken.

When row lines are arranged to have the same pitch as cells, spaces in which the row lines come into contact with wiring on a different layer often cannot be preserved. However, as shown in FIG. 8, when the pitch D1 of redundant row lines RRL0 to RRLn is set to be larger than the pitch of cells (that is, pitch D2 of row lines RL0 to RLn), contacts can be created. This is because since the number of redundant cells is much smaller than the number of normal cells, even when the pitch of redundant row lines is made larger, the influence on the area of a whole chip is limited.

Figure 9:
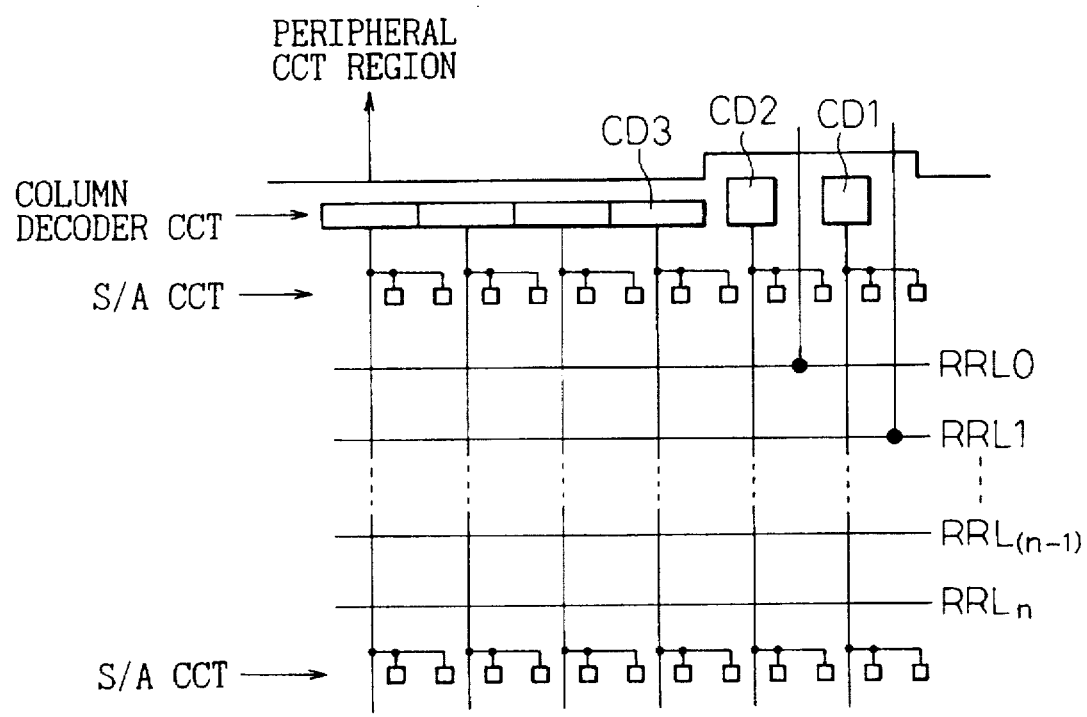
FIG. 9 is a diagram showing a portion of the configuration of a third embodiment of the present invention which is a constituent feature of the present invention.

In the aforesaid first embodiment, wiring passing through between adjoining ones of column decoders constituting each column decoder circuit (for example, power supply wirings VCC and VSS) is already laid out, and is partly replaced with wiring connected with redundant row lines. Even when such wiring is not laid out, the region of each column decoder circuit is substantially occupied by column decoders alone, and the area of the region is too small to offer an extra space, if measures are taken as mentioned below, the present invention can apply. FIG. 9 shows an example in which the measures are taken.

A column decoder is generally composed of a plurality of elements. By changing the positions of the elements, the elements can be laid out so that the column decoder has as a whole a lengthwise or sideways elongated shape. As shown in FIG. 9, column decoders CD1 and CD2 located near positions at which wiring to be connected with redundant row lines is supposed to run through are shaped differently from the other column decoders CD3 (in the illustrated example, shaped substantially like a square). Consequently, wiring to be connected with redundant row lines can be run in unoccupied spaces. In the example shown in FIG. 9, the region of each column decoder circuit partly juts out to a peripheral circuit region. Since the peripheral circuit region is fundamentally designed to accommodate a set of circuits that can be laid out at random, an extra space for absorbing the jut can be preserved sufficiently.

What is claimed is:

1. A semiconductor memory device comprising:
   cell arrays each including a normal cell array portion and redundant cell array portion in which a plurality of normal cells and a plurality of redundant cells are arranged respectively;
   first wiring, laid out in a row direction within said redundant cell array portions, for selecting said redundant cells;
   second wiring orthogonal to said first wiring and formed on a different wiring layer from said first wiring;
   a peripheral circuit region; and
   a redundancy judgment circuit, placed in said peripheral circuit region, for determining the voltage level of said first wirings,
   wherein said first wiring is connected with said second wiring within said cell arrays, and thus connected to said redundancy judgment circuit by way of said second wiring.

2. The semiconductor memory device as set forth in claim 1, wherein column decoder circuits for selecting column lines running in a column direction within said normal cell array portions are placed adjacently to said cell arrays, and said second wiring is laid out so that it runs through the margins of first and second column decoders included in said column decoder circuits.

3. The semiconductor memory device as set forth in claim 1, wherein the pitch of said first wiring laid out within said redundant cell array portions is set to be larger than the pitch of a plurality of wires running in the same direction as said first wiring and laid out within said normal cell array portions.

4. The semiconductor memory device as set forth in claim 2, wherein said first and second column decoders are shaped differently from the other column decoders in order to preserve spaces in which said second wiring can run through.

5. The semiconductor memory device as set forth in claim 1, further comprising a plurality of power supply wires laid out within said cell arrays in the same direction as said second wiring according to a certain repetitive pattern, wherein said second wiring is laid out in place of part of said plurality of power supply wires.

6. The semiconductor memory device as set forth in claim 2, further comprising a plurality of power supply wires laid out within said cell arrays in the same direction as said second wiring according to a certain repetitive pattern, wherein said second wiring is laid out in place of part of said power supply wiring.

7. The semiconductor memory device as set forth in claim 3, further comprising a plurality of power supply wires laid out within said cell arrays in the same direction as said second wiring according to a certain repetitive pattern, wherein said second wiring is laid out in place of some of said power supply wires.

* * * * *

UNITED STATES PATENT AND TRADEMARK OFFICE
CERTIFICATE OF CORRECTION

PATENT NO. : 5,757,691

DATED : May 26, 1998

INVENTOR(S) : Hatakeyama

It is certified that error appears in the above-identified patent and that said Letters Patent is hereby corrected as shown below:

```
     On the title page,
     Item [22], delete "Jun. 5, 1997" insert therefor -- Jun. 4,

1997 --
```

Signed and Sealed this

Sixteenth Day of February, 1999

Attest:

*Acting Commissioner of Patents and Trademarks*

*Attesting Officer*